SEMICONDUCTOR A.C. SWITCH DEVICE

Filed Nov. 7, 1962 2 Sheets-Sheet 1

WITNESSES:
Bernard R. Gieguez
James F. Young

INVENTOR
John Philips
BY Gordon H. Telfer
ATTORNEY

SEMICONDUCTOR A.C. SWITCH DEVICE

Filed Nov. 7, 1962 2 Sheets-Sheet 2

United States Patent Office 3,280,386
Patented Oct. 18, 1966

3,280,386
SEMICONDUCTOR A.C. SWITCH DEVICE

John Philips, Pittsburgh, Pa., assignor to Westinghouse Electric Corporation, Pittsburgh, Pa., a corporation of Pennsylvania Filed Nov. 7, 1962, Ser. No. 235,986
2 Claims. (Cl. 317—234)

This invention relates generally to semiconductor switch devices and, more particularly, to a semiconductor controlled rectifier device which is capable of performing A.C. switching.

A semiconductor controlled rectifier is a device usually comprising four successive regions of alternate semiconductivity type material. These regions are called the cathode-emitter (or the cathode), the first base, the second base and the anode-emitter (or the anode), respectively. Contacts are provided on the cathode, anode and first base regions. The contact on the first base region is sometimes called the gate. The semiconductor controlled rectifier is characterized by the fact that it will withstand a relatively high voltage across the cathode and anode until a relatively small control signal is applied to the gate contact which produces switching to a hyperconductive state. To selectively energize A.C. loads using controlled rectifiers, it is presently necessary to employ two separate controlled rectifiers in a parallel arrangement with the cathode of one connected to the anode of the other and the load applied across the parallel combination so that regardless of the direction of the input voltage at any instant, properly applied control signals to the gates of each of the controlled rectifiers will provide a low resistance current path. This is necessary because a single controlled rectifier does not have a hyperconductive, negative resistance breakover characteristic in the reverse direction.

It is, of course, undesirable to have to employ two individually interconnected devices in order to achieve the single function of A.C. switching. Additional weight and bulk is thereby incurred and problems of matching characteristics of the two controlled rectifiers and of insuring reliability of soldered interconnections are encountered.

It is, therefore, an object of the present invention to provide an improved semiconductor switch device which is capable of performing A.C. switching.

Another object is to provide a unitary body of semiconductive material for performing A.C. switching having reduced weight and bulk over separate components.

The invention, in brief, is directed to a semiconductor switch device for A.C. switching comprising, within a unitary body of semiconductive material, regions for performing the functions of two four layer semiconductor switching devices, such as those known as semiconductor controlled rectifiers, of which one internal region serves as a region of each of the device portions which perform the switching functions. Interconnections are made between regions to provide the equivalent of two controlled rectifiers in parallel opposed arrangement.

More particularly, the unitary device in accordance with this invention includes a first semiconductive region of a first semiconductivity type; second, third, fourth and fifth semiconductive regions of a second semiconductivity type disposed on said first region and forming first, second, third and fourth p-n junctions therewith; sixth and seventh semiconductive regions of said first semiconductivity type each disposed on one of said regions of second semiconductivity type and forming fifth and sixth p-n junctions therewith and contact means on each of said second, third, fourth, fifth, sixth and seventh regions with interconnections between those on the second and sixth regions and between those on the third and seventh regions.

In a preferred form of the invention, the second, third, fourth and fifth semiconductive regions are diffused regions within a starting wafer which serves as the first semiconductive region and the sixth and seventh semiconductive regions are either alloy fused regions or diffused regions. Ease of fabrication is thereby achieved and, also, good control of characteristics particularly when it is desired that identical switching characteristics be provided in both directions for A.C. switching.

The present invention, both as to its organization and manner of operation, together with the above-mentioned and further objects and advantages thereof, may best be understood by reference to the following description, taken in connection with the accompanying drawings, in which.

Figures 1, 2:
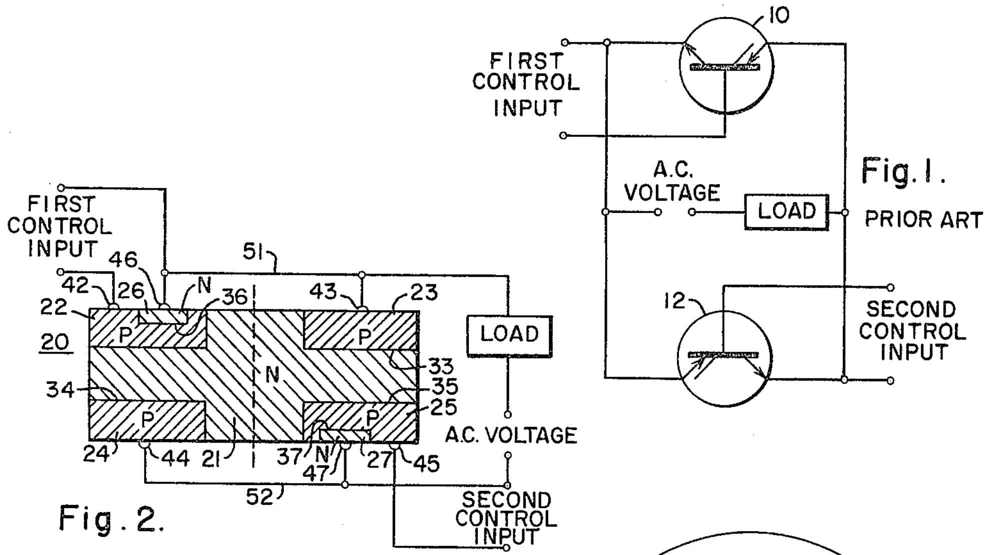
FIGURE 1 is a circuit schematic of two separate controlled rectifiers connected for A.C. switching in accordance with the prior art.
FIG. 2 is a circuit schematic including a cross-sectional view of a semiconductor device capable of providing the A.C. switching function of the devices of FIG. 1.

Referring to FIG. 1, an A.C. voltage source and an A.C. load, such as an A.C. motor, are applied across a parallel combination of two semiconductor controlled rectifiers 10 and 12 in opposed relationship. To energize the load circuit, a first control input is applied to the first controlled rectifier 10 so that it breaks over and becomes hyperconductive and, also, a second control input is applied to the second controlled rectifier so that it also breaks over and becomes hyperconductive. Therefore, regardless of the instantaneous polarity of the applied A.C. voltage a closed circuit is provided. If only a single controlled rectifier were used the circuit would be deenergized during at least half of the A.C. cycle.

Referring to FIG. 2, a circuit arrangement is shown including a unitary semiconductor device 20 constructed in accordance with the present invention which provides the functions of the two separate controlled rectifiers 10 and 12 of FIG. 1. The device 20 comprises a first region 21 of material which is here shown as n-type with second, third, fourth and fifth p-type regions 22 through 25 thereon and sixth and seventh n-type regions 26 and 27 on the second and fifth regions 22 and 25 thus forming a structure including six p-n junctions 32 through 37. Ohmic contacts 42 through 47 are provided on each of the regions except the first region. It will be noted that the device on each side of the dashed vertical centrally disposed reference line comprises a four layer structure which is here n-p-n-p on the left-hand side and p-n-p-n on the right-hand side.

In the left-hand device portion, from the top of the drawing, the sixth region 26 serves as a cathode emitter, the second region 22 serves as a first base region, the first region 21 serves as a second base region and the fourth region 24 serves as an anode-emitter. In the right-hand device portion, starting at the bottom of the figure, the seventh region 27 serves as a cathode-emitter, the fifth region 25 serves as a first base region, the first region 21 serves as a second base region and the third region 23 serves as an anode-emitter. It is therefore seen that the first region 21 serves as the second base region in each of the device portions. Conductive interconnections 51 and 52 are provided, respectively, between the cathode 26 of the left device portion and the anode 23 of the right device portion and between the anode 24 of the left device portion and the emitter 27 of the right device portion. The device portions have forward directions, that is, the direction from cathode to anode in which the hyperconductive, negative resistance breakover characteristic occurs, which are opposing so that either polarity of the A.C. voltage can be carried through the device upon the proper application of control input signals.

Structures in accordance with this invention can be fabricated in a number of ways such as by vapor diffusion to form some regions and alloying for others, diffusion alone, epitaxial crystal growing techniques or combinations of these techniques.

The relative size and extent of the various regions depends upon current requirements, encapsulation methods and contacting techniques. For example, the geometry may be as shown in FIG. 2 such as to provide an individual p-n-p-n device element in each half of a rectangular wafer or a circular geometry may be employed with one four layer device portion in the center and another four layer device portion on the perimeter. Such a device having circular geometry will be described hereinafter. It is generally desirable that both four layer device portions be of approximately equal area in order to handle equal currents and to have like breakover characteristics but where desired, differences may be intentionally provided. The placement and extent of the gate control ohmic contacts can also be varied.

In describing the invention, devices are shown in which each semiconductive region is designated as being of a particular semiconductivity type. However, the semiconductivity type of the various regions may be reversed from the order shown.

In the following discussion of specific embodiments of the present invention, they are described in a semiconductive body of silicon. In addition to silicon, however, other semiconductive materials such as germanium or a semiconductive compound are suitable. For example a compound of an element of Group III of the Periodic Table and an element of Group V of the Period Table, such as gallium arsenide or indium antimonide, is suitable. A compound of two elements of Group IV of the Periodic Table such as silicon carbide is also a suitable material.

Figure 3A:
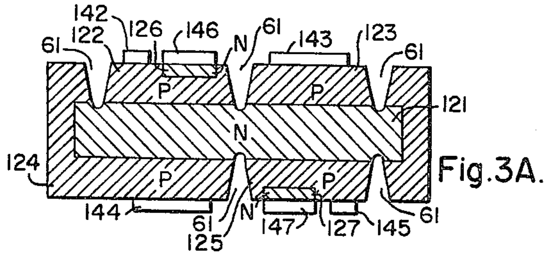
FIG. 3A is a cross-sectional view of a device in accordance with this invention formed by diffusion and alloy fusion techniques.
Figure 3B:
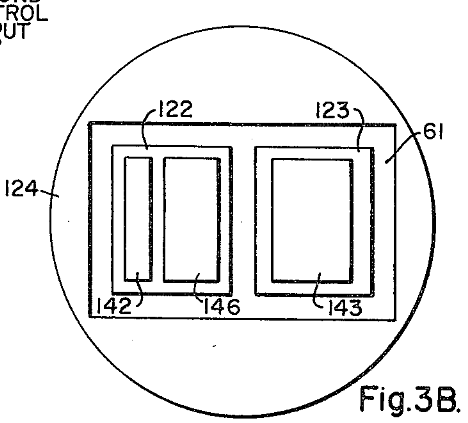
FIGS. 3B and 3C are, respectively, top and bottom views of the device of FIG. 3A.

In FIG. 3A, there is shown in cross-section an example of a device in accordance with this invention formed by a combination of diffusion and alloying techniques. FIGS. 3B and 3C are, respectively, top and bottom views of the device of FIG. 3A. In a starting wafer of n-type silicon having a resistivity of about 20 ohm-centimeters, a diameter of approximately ⅜ of an inch and a thickness of about 8 mils there was diffused a p-type impurity, aluminum, to convert the outside layer of about 2 mils thickness to p-type semiconductivity having a surface concentration of about $10^{17}$ acceptor atoms per cubic centimeter. Onto the exposed surfaces of the diffused p-type layer there were then provided rectangular fused alloy foil members to form regions 126 and 127 of n-type semiconductivity upon recrystallization of the fused region with the alloy forming ohmic contacts 146 and 147 thereon. By masking the surface and etching, grooves 61 were formed extending through the diffused layer into the substrate and dividing the diffused layer into four separate portions 122 through 125 forming physically separate junctions with the substrate.

The original substrate material provides the first region 121 of the device and the four regions 122 through 125 formed from the diffused layer provide the second, third, fourth and fifth regions of the device. The n-type regions 126 and 127 provide the sixth and seventh regions of the device. In addition each of the p-type regions has an ohmic contact 142 through 145 thereon which were formed in the same fusion operation by which the alloyed n-type regions are formed. For this purpose, gold containing a small amount of boron was used to form the ohmic contacts 142 through 145 on the p-type regions 122 through 125 and gold with a small percentage of antimony was used to form the rectifying contacts 126 and 127. Conductive interconnections (not shown) were made between contacts 146 and 143 and between contacts 144 and 147.

Figure 3D:
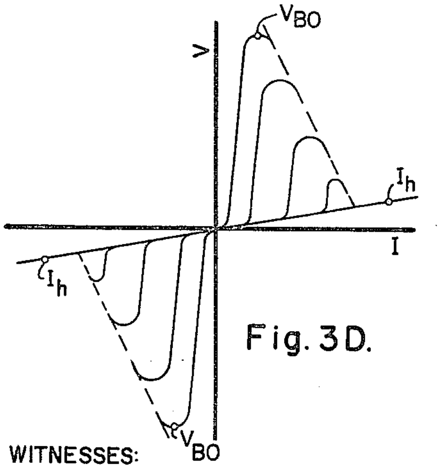
FIG. 3D is a graphical illustration of results obtained with the devices of FIGS. 3A, 3B and 3C.
Figure 3C:
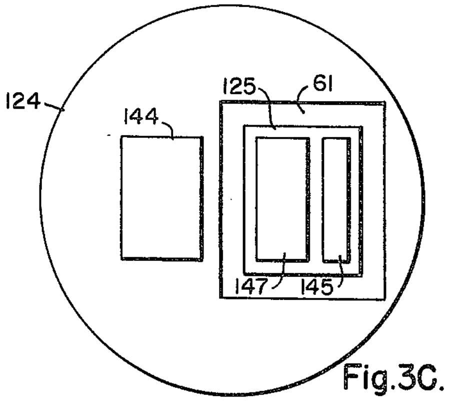

A device such as that just described was made and tested and found to have the following characteristics, which are presented graphically in FIG. 3D. The first quadrant results are for the left-hand device portion of FIG. 3A and the third quadrant results are for the right-hand device portion.

First quadrant:

$V_{BO}$>500 volts.
$I_{bf}$ 5 ma.
$I_h$ 7 ma.
$V_f$ 1.2 volts.

Third quadrant:

$V_{BO}$>500 volts.
$I_{bf}$ 2.8 ma.
$I_h$ 7 ma.
$V_f$ 1.0 volts.

The foregoing symbols are defined as:

$V_{BO}$—Breakover voltage (amount of voltage across anode and cathode to produce switching without a gate signal).

$I_{bf}$—Turn-on base current (gate current required to continually maintain on state).

$I_h$—Holding current (amount of current from anode to cathode which must be supplied in the on state to prevent switching to the off state).

$V_f$—Forward drop in on state when current was approximately 50 ma.

Greater current handling capacity can be achieved in this type by merely scaling up the dimensions of the device. The characteristics observed in the two quadrants are sufficiently identical for most A.C. switching applications.

Figure 4:
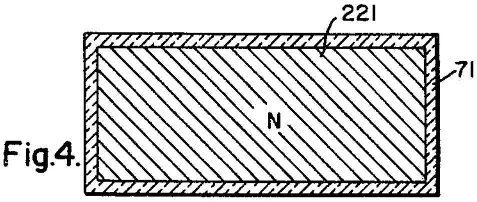
FIGS. 4 through 9 are cross-sectional views of a device in accordance with this invention formed by double diffusion at various stages in the fabrication process.
Figure 5:
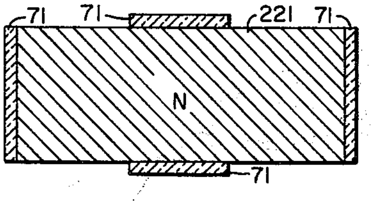
Figure 6:
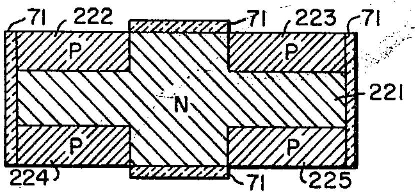
Figure 7:
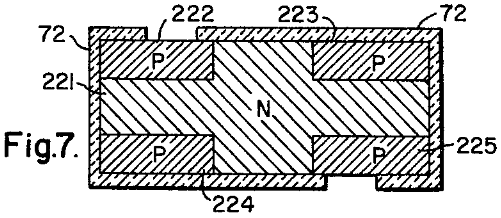

Another method of fabrication of the device of this invention will now be described with reference to FIGS. 4 through 9. In FIG. 4 a semiconductor wafer 221 is shown having a thickness of about 6 to 8 mils and a diameter of about ½ inch. In this example, the wafer 221 is of n-type silicon having a resistivity of about 20 ohm-centimeters. An oxide layer ($SiO_2$) 71 is grown over the entire wafer surface such as by heating the wafer in an atmosphere containing argon and water vapor. The oxide layer should have a thickness of at least about 10,000 A. so that upon subsequent diffusion of boron impurities into selected clean areas of the wafer the boron will not be able to penetrate the oxide layer and convert the silicon underlying it to p-type. In FIG. 5 the wafer 221 is shown after portions of the oxide layer 71 have been removed by utilizing a mask such as one of apiezon wax and etching such as by a hydrofluoric acid etchant. The exposed surface of the wafer 221 is that in which it is desired to form p-type regions. Then boron is diffused into the exposed surfaces of the wafer in any suitable manner to create p-type regions 222 through 225 as illustrated in FIG. 6 having a depth of about 1.5 mils with a surface concentration of approximately $5\times10^{18}$ atoms per cubic centimeter.

Figure 8:
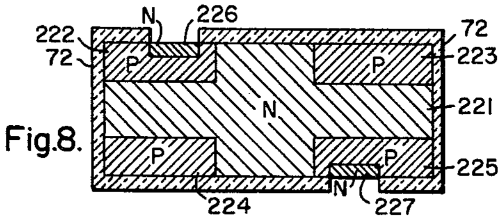

The original oxide layer is then entirely removed by a suitable etchant and a new oxide film grown over the entire wafer again. This oxide layer 72 is again removed in selected areas as allustrated in FIG. 7 leaving exposed those portions of the regions 222 and 225 into which it is desired to diffuse a donor type impurity. The wafer is then diffused with a donor type impurity such as phosphorus to form the n-type regions 226 and 227 as shown in FIG. 8. Subsequent processing includes removel of the oxide layer 72 and the alloying of suitable ohmic contacts 242 through 247 to the regions as shown in FIG. 9.

Figure 9:
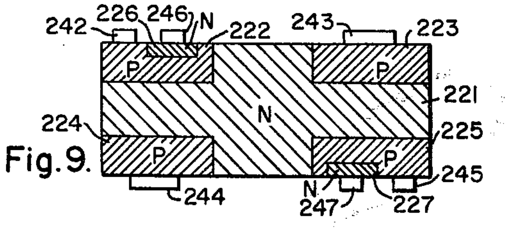

Interconnections between the contacts 246 and 243 and between contacts 244 and 247 of the device of FIG. 9 are made like those in FIG. 2. Since the device is then encapsulated as a unit, the reliability of the interconnections is assured. One of the ways to form the conductive interconnections and ohmic contacts is to form an oxide layer over the entire wafer surface, remove the oxide at those points where contact is to be made to the semiconductive surface, evaporate metal through a mask at those points and across the oxide layer between contacts 246 and 243 and between contacts 244 and 247 and then heating to alloy the metal.

One of the previously mentioned alternative geometries for a device in accordance with this invention was a ring structure in which the two device portions providing controlled rectifier functions are concentrically oriented. Such a structure is shown in top and bottom views in FIGS. 10A and 10B with the cross-sectional view of FIG. 10C indicating the manner of interconnecting the regions and encapsulating the device. From these views it can be seen that the n-type substrate 321 has on the top major surface a diffused p-type region 322 in the form of a circle at the center of the surface surrounded by an annular ring 323 of diffused p-type material. The bottom surface has a similar arrangement of a p-type dot 324 and annular ring 325. On the upper surface the p-type dot 322 in the center has therein a diffused n-type region 326. On the lower surface the annular p-type ring 325 has therein a diffused annular ring 327 of n-type material. Thus, the center portion of the structure and the peripheral portion of the structure each comprises a four layer n-p-n-p structure with the substrate 321 as a common region.

Figure 10C:
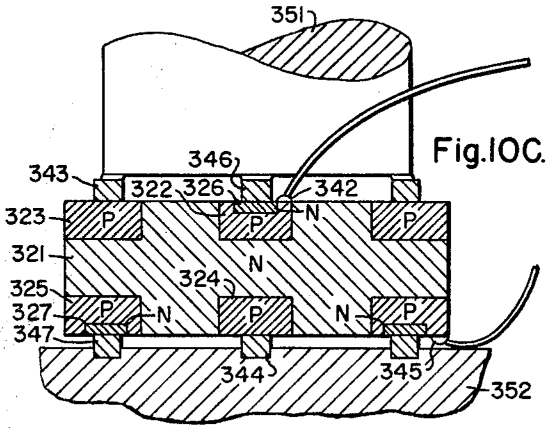
FIG. 10C is a cross-sectional view of the device of FIGS. 10A and 10B.
Figure 10A:
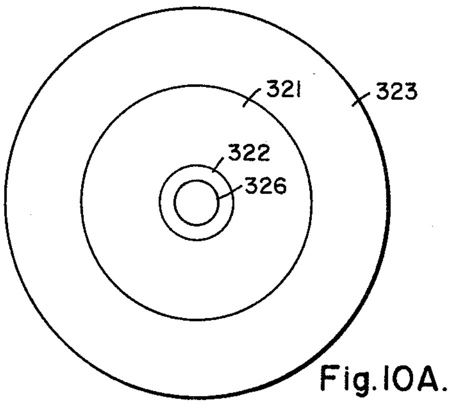
FIGS. 10A and 10B are, respectively, top and bottom views of another embodiment of this invention wherein a circular geometry is employed.
Figure 10B:
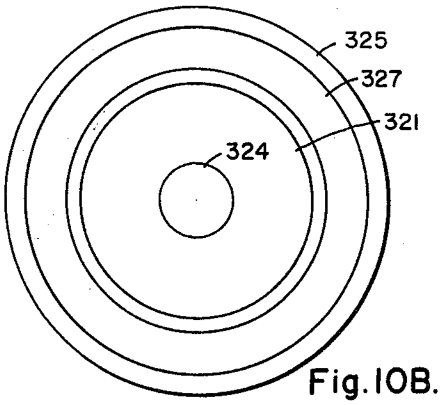

In FIG. 10C, conductive member 343 and 346 are shown fused to the p-type annular ring 323 and the n-type region 326, respectively, on the upper surface which are in turn joined to a lead member 351. The conductive members 343 and 346 may be of molybdenum and the lead 351 of silver brazed to the molybdenum members. A conductive lead is attached to the p-type dot 322 on the upper surface at the contact 342.

On the lower surface molybdenum conductive members 344 and 347 are also joined to the p-type dot 324 and the n-type diffused ring 327 which are in turn joined to a conductive base 352 which may be of copper. A lead member is affixed to the p-type annular ring 325 at the contact 345. Thus, it will be seen that lead attachment may be accomplished readily. If desired, the gate contact 345 can be even more conveniently disposed by extending the region 325 around the edge surfaces of the wafer so contact 345 may be made on the upper surface of the device. The lead from contact 342 can, if desired, be positioned within an aperture in the lead 351 but not in electrical contact with lead 351.

A further modification of this invention employs the teachings of copending application Serial No. 649,038, filed March 28, 1957 by J. Philips and assigned to the same assignee as the present invention. The copending application teaches that a hyperconductive, negative resistance switching characteristic can be achieved with a device comprising three regions of semiconductive material, such as germanium, of alternate semiconductivity type and a fourth region of a mass of metal so formed as to be capable of injecting minority carriers into the adjacent semiconductive region. With reference to FIG. 2 again, regions 23 and 24 were described as being of p-type semiconductive material and serve as the anodes of the two device portions, could instead each be a mass of metal in accordance with the copending application which should be referred to for a more complete teaching of the fabrication of such devices.

While the present invention has been shown and described in certain forms only, it will be obvious to those skilled in the art that it is not so limited but is susceptible of various changes and modifications without departing from the spirit and scope thereof.

What is claimed is:

1. A semiconductor switch device capable of performing A.C. switching comprising: a unitary body of semiconductive material including a substrate of a first type of semiconductivity having opposing major surfaces and comprising a first region of said device; second and third separate regions of a second type of semiconductivity in p-n junction forming relation with a first major surface of said substrate; fourth and fifth separate regions of said second type of semiconductivity in p-n junction forming relation with a second major surface of said substrate said fourth region being directly opposite said second region and said fifth region being directly opposite said third region; a sixth region of material of said first type of semiconductivity in p-n junction forming relation with said second region and a seventh region of said first type of semiconductivity in p-n junction forming relation with said fifth region to provide two four layer device portions including said sixth, second, first and fourth regions in one portion and said third, first, fifth, and seventh regions in the other device portion; a separate ohmic contact on each of said second, third, fourth, fifth, sixth and seventh regions; conductive interconnection means between the ohmic contacts on said sixth and third regions and between the ohmic contacts on said fourth and seventh regions for application of an A.C. potential thereacross to be selectively switched by application of control signals to the ohmic contacts on said second and fifth regions.

2. A semiconductor switch device capable of performing A.C. switching comprising: a unitary body of semiconductive material including a substrate of a first type of semiconductivity having opposing major surfaces and comprising a first region of said device; second and third separate regions of a second type of semiconductivity disposed on a first major surface of said substrate; fourth and fifth separate regions of said second type of semiconductivity disposed on the second major surface of said substrate, said fourth region being directly opposite said second region and said fifth region being directly opposite said third region; a sixth region of material of said first type of semiconductivity disposed on said second region and a seventh region of said first type of semiconductivity disposed on said fifth region to provide two four layer device portions including said sixth, second, first and fourth regions in one portion and said third first, fifth, and seventh regions in the other device portion; said second and said fourth region each having a generally circular configuration; said third region and said fifth region each having a generally annular configuration surrounding said second region and said fourth region, respectively; said second, third, fourth and fifth regions being of diffused semiconductive material; ohmic contacts on said second, third, fourth, fifth, sixth and seventh regions; conductive interconnection means between the ohmic contacts on said sixth and third regions and between the ohmic contacts on said fourth and seventh regions for application of an A.C. potential thereacross to be selectively switched by application of control signals to the ohmic contacts on said second and fifth regions.

References Cited by the Examiner

UNITED STATES PATENTS

| | | | |
|---|---|---|---|
| 3,123,750 | 3/1964 | Hutson et al. | 317—235 |
| 3,196,330 | 7/1965 | Moyson | 317—234 |

JOHN W. HUCKERT, *Primary Examiner.*

M. EDLOW, L. ZALMAN, *Assistant Examiners.*